(12) United States Patent
Mihara

(10) Patent No.: US 7,112,469 B2
(45) Date of Patent: Sep. 26, 2006

(54) METHOD OF FABRICATING A SEMICONDUCTOR PACKAGE UTILIZING A THERMOSETTING RESIN BASE MEMBER

(75) Inventor: Ichiro Mihara, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 11/037,423

(22) Filed: Jan. 18, 2005

(65) Prior Publication Data

US 2005/0161803 A1    Jul. 28, 2005

(30) Foreign Application Priority Data

Jan. 27, 2004   (JP)   ............... 2004-018536

(51) Int. Cl.
   *H01L 21/50*   (2006.01)
(52) U.S. Cl. ............ 438/110; 438/125; 438/458
(58) Field of Classification Search ................ None
   See application file for complete search history.

(56) References Cited

U.S. PATENT DOCUMENTS

| 6,590,291 | B1 * | 7/2003 | Akagawa | 257/774 |
|---|---|---|---|---|
| 6,770,971 | B1 * | 8/2004 | Kouno et al. | 257/734 |
| 6,882,054 | B1 * | 4/2005 | Jobetto | 257/759 |
| 6,930,395 | B1 * | 8/2005 | Tomekawa et al. | 257/773 |
| 6,964,887 | B1 * | 11/2005 | Akagawa | 438/126 |
| 2002/0189860 | A1 * | 12/2002 | Wakako et al. | 174/261 |
| 2004/0124547 | A1 * | 7/2004 | Jobetto | 257/791 |
| 2004/0245614 | A1 * | 12/2004 | Jobetto | 257/678 |
| 2004/0262716 | A1 * | 12/2004 | Aoki | 257/619 |
| 2005/0062147 | A1 * | 3/2005 | Wakisaka et al. | 257/712 |
| 2005/0098891 | A1 * | 5/2005 | Wakabayashi et al. | 257/758 |
| 2005/0140007 | A1 * | 6/2005 | Jobetto | 257/738 |
| 2005/0161799 | A1 * | 7/2005 | Jobetto | 257/690 |
| 2005/0161803 | A1 * | 7/2005 | Mihara | 257/698 |
| 2005/0161823 | A1 * | 7/2005 | Jobetto et al. | 257/758 |
| 2005/0200018 | A1 * | 9/2005 | Wakisaka et al. | 257/738 |
| 2005/0218451 | A1 * | 10/2005 | Jobetto | 257/347 |
| 2005/0269698 | A1 * | 12/2005 | Okada et al. | 257/737 |

FOREIGN PATENT DOCUMENTS

JP   2003-298005 A   10/2003

* cited by examiner

*Primary Examiner*—Alonzo Chambliss
(74) *Attorney, Agent, or Firm*—Frishauf, Holtz, Goodman & Chick, P.C.

(57) ABSTRACT

A semiconductor device includes a base member made of a material containing at least a thermosetting resin, and at least one semiconductor constructing body mounted on the base member, and having a semiconductor substrate and a plurality of external connecting electrodes formed on the semiconductor substrate. An insulating layer is formed on the base member around the semiconductor constructing body. An interconnection of at least one layer is formed on one sides of the semiconductor constructing body and insulating layer, electrically connected to the external connecting electrode of the semiconductor constructing body, and having a connecting pad portion, the semiconductor substrate is fixed to the base member by fixing force of the base member.

8 Claims, 21 Drawing Sheets

METHOD OF FABRICATING A SEMICONDUCTOR PACKAGE UTILIZING A THERMOSETTING RESIN BASE MEMBER

CROSS-REFERENCE TO RELATED APPLICATIONS

This application is based upon and claims the benefit of priority from prior Japanese Patent Application No. 2004-018536, filed Jan. 27, 2004, the entire contents of which are incorporated herein by reference.

BACKGROUND OF THE INVENTION

1. Field of the Invention

The present invention relates to a semiconductor device and a method of fabricating the same.

2. Description of the Related Art

The conventional semiconductor device disclosed in Jpn. Pat. Appln. KOKAI Publication No. 2003-298005 (P2003-298005A) includes solder balls as connecting terminals for external connection outside the size of a silicon substrate. Therefore, this semiconductor device has a structure in which a silicon substrate having a plurality of connecting pads on its upper surface is adhered to the upper surface of a base plate via an adhesive layer, an insulating layer is formed on the upper surface of the base plate around the silicon substrate, an upper insulating film is formed on the upper surfaces of the silicon substrate and insulating layer, upper interconnections are formed on the upper surface of the upper insulating film and connected to the connecting pads of the silicon substrate, portions except for connecting pad portions of the upper interconnections are covered with an uppermost insulating film, and solder balls are formed on the connecting pad portions of the upper interconnections.

In this conventional semiconductor device, the silicon substrate is adhered to the upper surface of the base plate via the adhesive layer provided therebetween. This increases the total thickness by the thickness of the adhesive layer. Also, during reflow (the temperature is 240° C. to 260° C.) when the semiconductor device is mounted on a circuit board via the solder balls, voids and water in the adhesive layer expand. This adversely affects the adhesive force, and deteriorates the reliability of adhesion of the silicon substrate to the base plate.

BRIEF SUMMARY OF THE INVENTION

It is, therefore, an object of the present invention to provide a semiconductor device and a method of fabricating the same which can improve the reliability of adhesion of a semiconductor constructing body to a base member.

According to an aspect of the present invention, there is provided a semiconductor device comprising a base member made of a material containing at least a thermosetting resin, at least one semiconductor constructing body mounted on the base member, and having a semiconductor substrate and a plurality of external connecting electrodes formed on the semiconductor substrate, an insulating layer formed on the base member around the semiconductor constructing body, and an interconnection of at least one layer, formed on one sides of the semiconductor constructing body and insulating layer and electrically connected to the external connecting electrode of the semiconductor constructing body, the interconnection having a connecting pad portion, wherein the semiconductor substrate is fixed to the base member by fixing force of the base member.

According to another aspect of the present invention, there is provided a semiconductor device fabrication method comprising temporarily fixing, on a base member formation member made of a material containing at least a semi-hardened thermosetting resin, a plurality of semiconductor constructing bodies each having a semiconductor substrate and a plurality of external connecting electrodes formed on the semiconductor substrate, such that the plurality of semiconductor constructing bodies are separated from each other, forming a base member by hardening the thermosetting resin contained in the base member formation member, fixing the semiconductor constructing bodies to the base member by fixing force of the base member, and forming an insulating layer on the base member around the semiconductor constructing bodies, forming at least one layer of an interconnection on the semiconductor constructing bodies and insulating layer, such that the interconnection is connected to the external connecting electrodes, and cutting the insulating layer and base member between the semiconductor constructing bodies to obtain a plurality of semiconductor devices each including at least one semiconductor constructing body.

In these aspects, the semiconductor constructing body is directly fixed to the base member made of the material containing at least a thermosetting resin. Since no such adhesive layer as used in the conventional device is used, the semiconductor device can be made thin accordingly. In addition, the reliability of adhesion of the semiconductor constructing body to the base member can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention and, together with the general description given above and the detailed description of the embodiments given below, serve to explain the principles of the invention.

DETAILED DESCRIPTION OF THE INVENTION

First Embodiment

Figure 1:
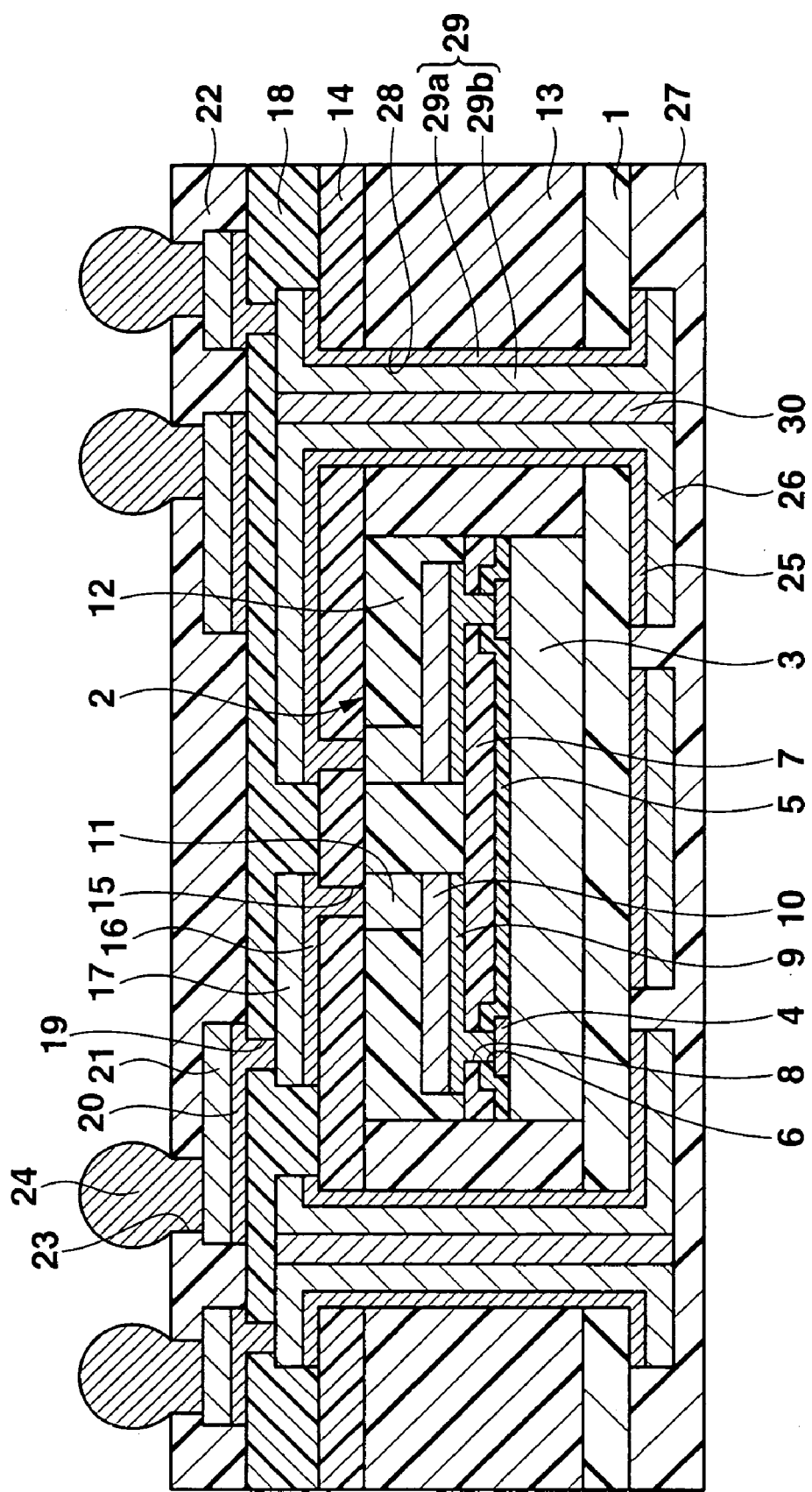
FIG. 1 is a sectional view of a semiconductor device according to the first embodiment of the present invention.

FIG. 1 is a sectional view of a semiconductor device according to the first embodiment of the present invention. This semiconductor device includes a base plate (base member) 1 having a square or rectangular planar shape. The base plate 1 is obtained by hardening a thermosetting resin containing reinforcing materials into the form of a sheet. Although the material of the base plate 1 is not limited, a preferred example is a material called a prepreg material obtained by impregnating a substrate formed by a fiber-like reinforcing material, e.g., fibers made of an inorganic material such as glass or aramid fibers, with a thermosetting resin such as an epoxy-based resin, and semi-hardening the resultant substrate (by B-stage hardening).

The lower surface of a semiconductor constructing body 2 having a square or rectangular planar shape and a size smaller to a certain degree than the size of the base plate 1 is directly fixed to the upper surface of the base plate 1. The semiconductor constructing body 2 has interconnections 10, columnar electrodes 11, and a sealing film 12 (all of which will be explained later), and is generally called a CSP (Chip Size Package). Since individual semiconductor constructing bodies 2 are obtained by dicing after the intercon-nections 10, columnar electrodes 11, and sealing film 12 are formed on a silicon wafer as will be described later, the semiconductor constructing body 2 is particularly called a wafer level CSP (W-CSP). The structure of the semiconductor constructing body 2 will be explained below.

The semiconductor constructing body 2 includes a silicon substrate (semiconductor substrate) 3. The lower surface of the silicon substrate 3 is directly fixed to the upper surface of the base plate 1 by a fixing force of the base plate. An integrated circuit (not shown) having a predetermined function is formed on the upper surface of the silicon substrate 3. A plurality of connecting pads 4 made of, e.g., an aluminum-based metal are formed on the periphery of the upper surface so as to be electrically connected to the integrated circuit. An insulating film 5 made of silicon oxide or the like is formed on the upper surface of the silicon substrate 3 except for central portions of the connecting pads 4. These central portions of the connecting pads 4 are exposed through holes 6 formed in the insulating film 5.

A protective film 7 made of, e.g., an epoxy-based resin or polyimide-based resin is formed on the entire upper surface of the insulating film 5. Holes 8 are formed in those portions of the protective film 7, which correspond to the holes 6 in the insulating film 5. Metal undercoatings 9 made of copper or the like are formed on the upper surface of the protective film 7. The copper interconnections 10 are respectively formed on the entire upper surface of the metal undercoatings 9. One end portion of each interconnection 10 is electrically connected to the connecting pad 4 by a part of the metal undercoating 9 through the holes 6 and 8.

The columnar electrodes (external connecting electrodes) 11 made of copper are formed on the upper surfaces of connecting pad portions of the interconnections 10. The sealing film 12 made of, e.g., an epoxy-based resin or polyimide-based resin is formed on the upper surface of the protective film 7 and the interconnections 10, such that the upper surface of the sealing film 12 is leveled with the upper surfaces of the columnar electrodes 11. As described above, the semiconductor constructing body 2 called a W-CSP includes the silicon substrate 3, connecting pads 4, and insulating film 5, and also includes the protective film 7, undercoatings 9 interconnections 10, columnar electrodes 11, and sealing film 12.

A square or rectangular frame-like insulating layer 13 is formed on the upper surface of the base plate 1 around the semiconductor constructing body 2, such that the upper surface of the insulating layer 13 is substantially leveled with the upper surface of the semiconductor constructing body 2. The insulating layer 13 is made of a thermosetting resin such as an epoxy-based resin or polyimide-based resin, or a material obtained by mixing, in a thermosetting resin like this, reinforcing materials such as silica fillers or glass fibers.

On the upper surfaces of the semiconductor constructing body 2 and insulating layer 13, a first upper insulating film 14 is formed to have a flat upper surface. The insulating film 14 is usually called a buildup material for use in a buildup substrate, and formed by mixing reinforcing materials, e.g., fibers made of an inorganic material such as silica or glass, in a thermosetting resin such as an epoxy-based resin or BT (Bismaleimide Triazine) resin.

Holes 15 are formed in those portions of the first upper insulating film 14, which correspond to the central portions of the upper surfaces of the columnar electrodes 11. A first upper metal undercoating 16 made of copper or the like is formed on the upper surface of the first upper insulating film 14. First upper interconnections 17 made of copper are formed on the entire upper surface of the first upper metal undercoating 16. One end portion of each first upper interconnection 17 including the first upper metal undercoating 16 is electrically connected to the upper surface of the columnar electrode 11 through the hole 15 in the first upper insulating film 14.

A second upper insulating film 18 made of the same material as the first upper insulating film 14 is formed on the upper surfaces of the first film 14 and the first upper interconnections 17. Holes 19 are formed in those portions of the upper insulating film 18, which correspond to connecting pad portions of the first upper interconnections 17. Second upper metal undercoatings 20 made of copper or the like are formed on the upper surface of the second upper insulating film 18. Second upper interconnections 21 made of copper are respectively formed on the entire upper surface of the second upper metal undercoatings 20. One end portion of each second upper interconnection 21 including is connected to the connecting pad portion of the first upper interconnection 17 by a part of the second upper metal undercoating 20 via the hole 19 in the second upper insulating film 18.

An uppermost insulating film 22 made of a solder resist or the like is formed on the upper surfaces of the second upper insulating film 18 and the second upper interconnections 21. Holes 23 are formed in those portions of the uppermost insulating film 22, which correspond to connecting pad portions of the second upper interconnections 21. Solder balls 24 are formed in and above the holes 23 so as to be electrically and mechanically connected to the connecting pad portions of the second upper interconnections 21. The solder balls 24 are arranged in a matrix on the uppermost insulating film 22.

Lower metal undercoatings 25 made of copper or the like are formed on the lower surface of the base plate 1. Lower interconnections 26 made of copper are formed on the entire lower surfaces of the lower metal undercoatings 25. A lower insulating film 27 made of a solder resist or the like is formed on the lower surfaces of the base plate 1 and the lower interconnections 26.

At least portions of the first upper interconnections 17 including the first upper metal undercoating 16 and the lower interconnections 26 including the lower metal undercoating 25 are electrically connected via vertical conducting portions 29 made up of a metal undercoating 29a and copper layer 29b formed using copper or the like on the inner wall surfaces of through holes 28 formed in predetermined portions of the first upper insulating film 14, insulating layer 13, and base plate 1. Each vertical conducting portion 29 is filled with a conductive material 30 such as copper paste, silver paste, or conductive resin, in order to secure a high reliable electric continuity between the upper and lower interconnections. The conductive material 30 is inserted in a vertical through hale formed in the copper layer 29b. Alternately, the vertical conducting portion 29 may also be filled with insulating resin or hollow.

The size of the base plate 1 is made larger to some extent than the size of the semiconductor constructing body 2, in order to make the size of the formation region of the solder balls 24 larger to a certain degree than that of the semiconductor constructing body 2 in accordance with the increase in number of the connecting pads 4 on the silicon substrate 3, thereby making the size and pitch of the connecting pad portions (the portions in the holes 23 of the uppermost insulating film 22) of the second upper interconnections 21 larger than those of the columnar electrodes 11.

Accordingly, those connecting pad portions of the second upper interconnections 21, which are arranged in a matrix are formed not only in a region corresponding to the semiconductor constructing body 2 (not shown in FIG. 1), but also in a region corresponding to the insulating layer 13 formed outside the semiconductor constructing body 2. That is, of the solder balls 24 arranged in a matrix, at least outermost solder balls 24 are formed in a periphery positioned outside the semiconductor constructing body 2.

Figure 2:
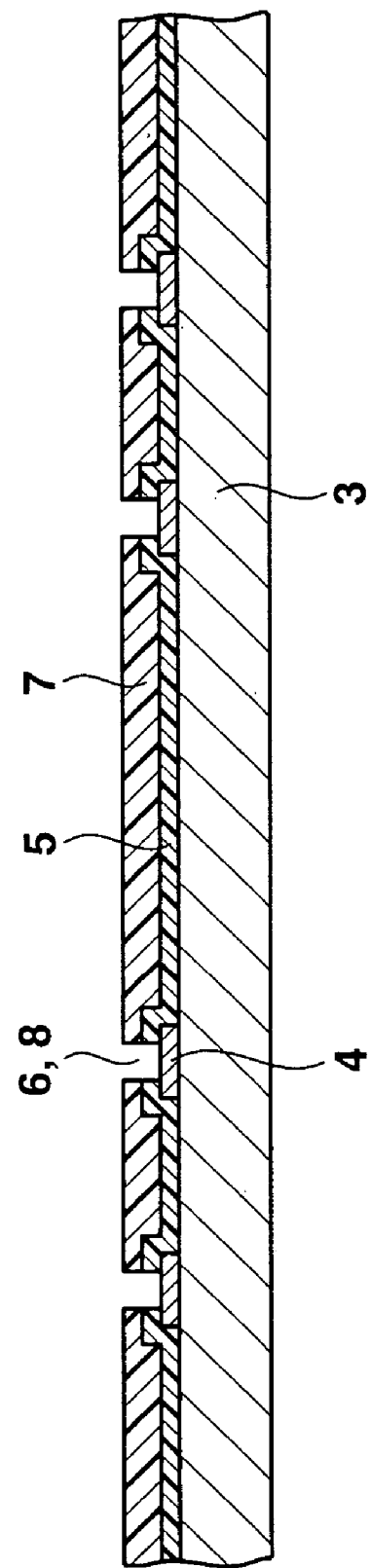
FIG. 2 is a sectional view of an assembly initially prepared in an example of a method of fabricating the semiconductor device shown in FIG. 1.

An example of a method of fabricating this semiconductor device will be described below. First, an example of the fabrication method of the semiconductor constructing body 2 will be explained. In this method, an assembly as shown in FIG. 2 is prepared. In this assembly, connecting pads 4 made of, e.g., an aluminum-based metal, an insulating film 5 made of, e.g., silicon oxide, and a protective film 7 made of, e.g., an epoxy-based resin or polyimide-based resin are formed on a wafer-like silicon substrate (semiconductor substrate) 3. Central portions of the connecting pads 4 are exposed through holes 6 and 8 formed in the insulating film 5 and protective film 7.

In the wafer-like silicon substrate 3 having this structure, an integrated circuit having a predetermined function is formed in a region where each semiconductor constructing body is to be formed, and each connecting pad 4 is electrically connected to the integrated circuit formed in the corresponding region.

Figure 3:
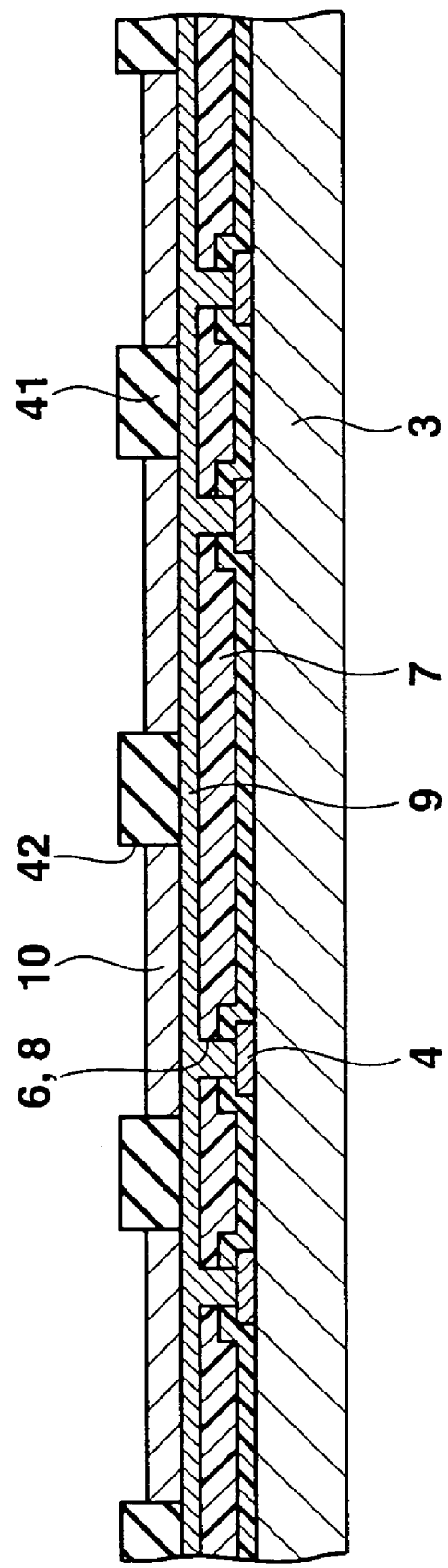
FIG. 3 is a sectional view of a fabrication step following FIG. 2.

As shown in FIG. 3, a metal undercoating 9 is formed on the entire upper surface of the protective film 7 including the upper surfaces of the connecting pads 4 exposed through the holes 6 and 8. The metal undercoating 9 can be any of a copper layer formed by electroless plating, a copper layer formed by sputtering, and a combination of a thin film of titanium or the like formed by sputtering and a copper layer formed on this thin film by sputtering.

A plating resist film 41 is formed by patterning on the upper surface of the metal undercoating 9. In this state, holes 42 are formed in those portions of the plating resist film 41, which correspond to regions where interconnections 10 are to be formed. Electroless plating of copper is then performed by using the metal undercoating 9 as a plating current path, thereby forming interconnections 10 on the upper surface of the metal undercoating 9 in the holes 42 of the plating resist film 41. After that, the plating resist film 41 is removed.

Figure 4:
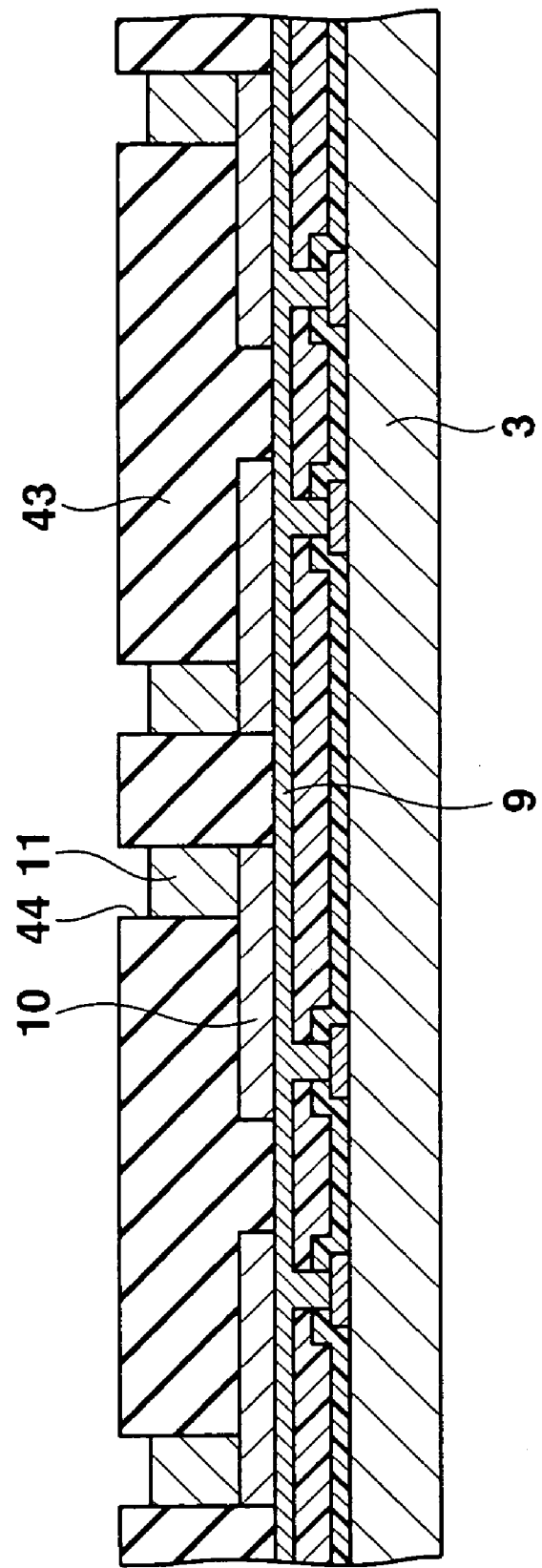
FIG. 4 is a sectional view of a fabrication step following FIG. 3.
Figure 5:
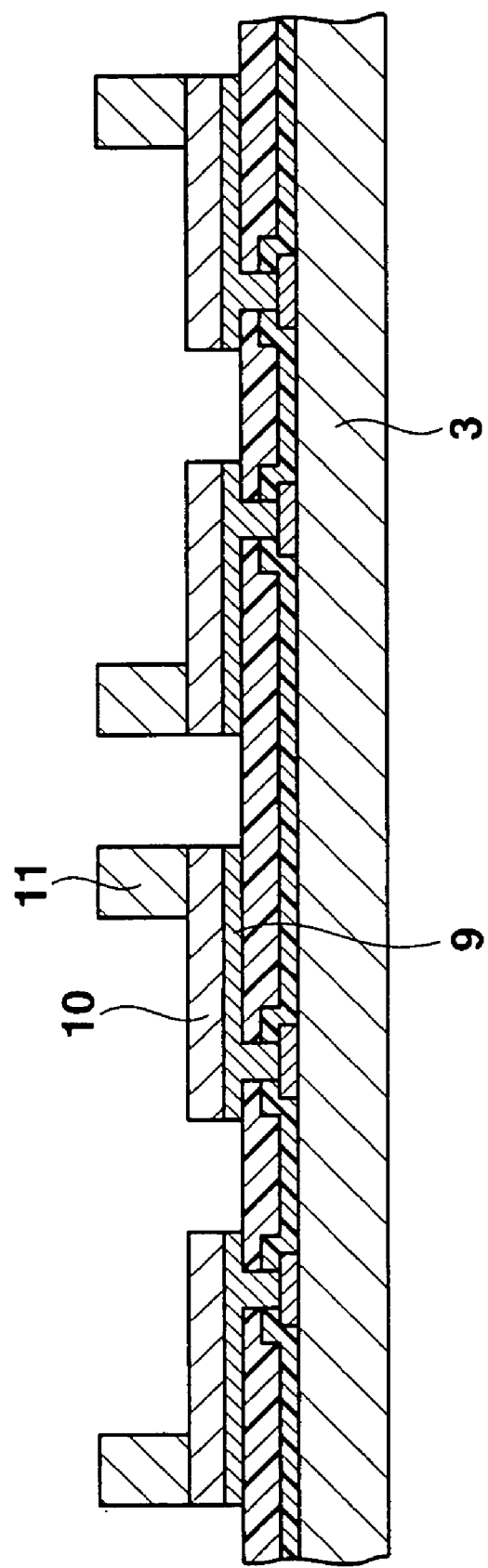
FIG. 5 is a sectional view of a fabrication step following FIG. 4.

As shown in FIG. 4, a plating resist film 43 is formed by patterning on the upper surface of the metal undercoating 9 including the interconnections 10. In this state, holes 44 are formed in those portions of the plating resist film 43, which correspond to regions where columnar electrodes 11 are to be formed. Electroless plating of copper is then performed by using the metal undercoating 9 as a plating current path, thereby forming columnar electrodes 11 on the upper surfaces of connecting pad portions of the interconnections 10 in the holes 44 of the plating resist film 43. After that, the plating resist film 43 is removed, and unnecessary portions of the metal undercoating 9 are etched away by using the interconnections 10 as masks. Consequently, as shown in FIG. 5, the metal undercoating 9 remains only below the interconnections 10.

Figure 6:
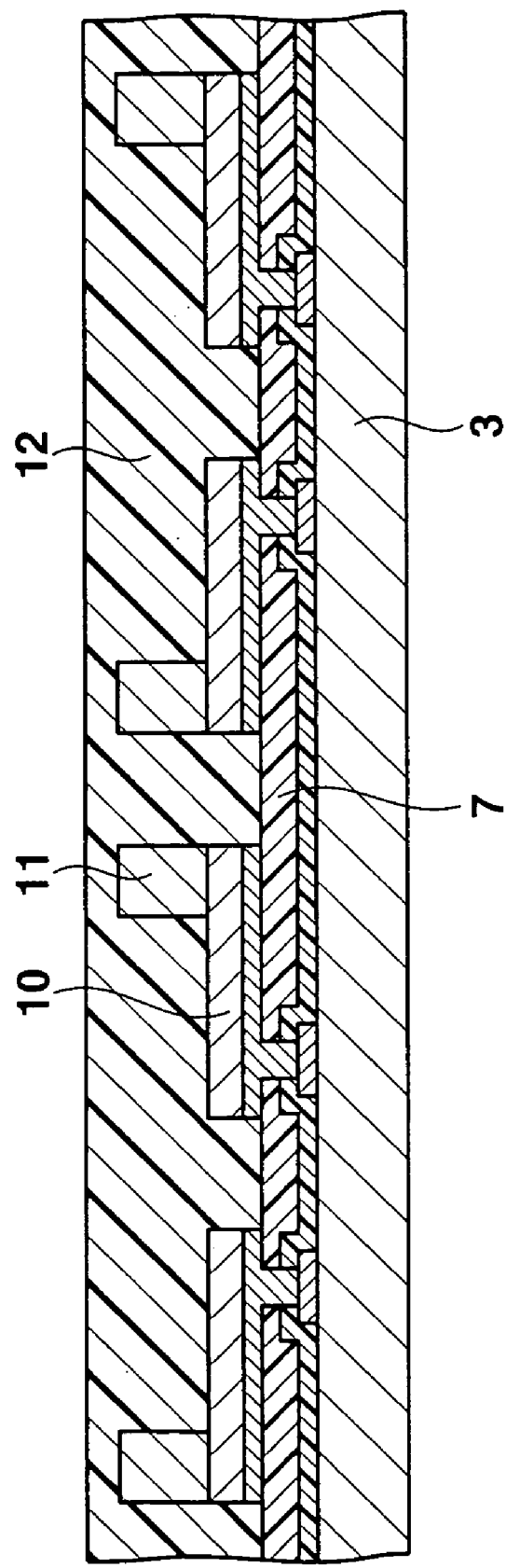
FIG. 6 is a sectional view of a fabrication step following FIG. 5.

As shown in FIG. 6, a sealing film 12 made of, e.g., an epoxy-based resin or polyimide-based resin is formed on the entire upper surface of the protective film 7 including the columnar electrodes 11 and interconnections 10 by, e.g., screen printing, spin coating, or die coating, such that the thickness of the sealing film 12 is larger than the height of the columnar electrodes 11. In this state, therefore, the upper surfaces of the columnar electrodes 11 are covered with the sealing film 12.

Figure 7:
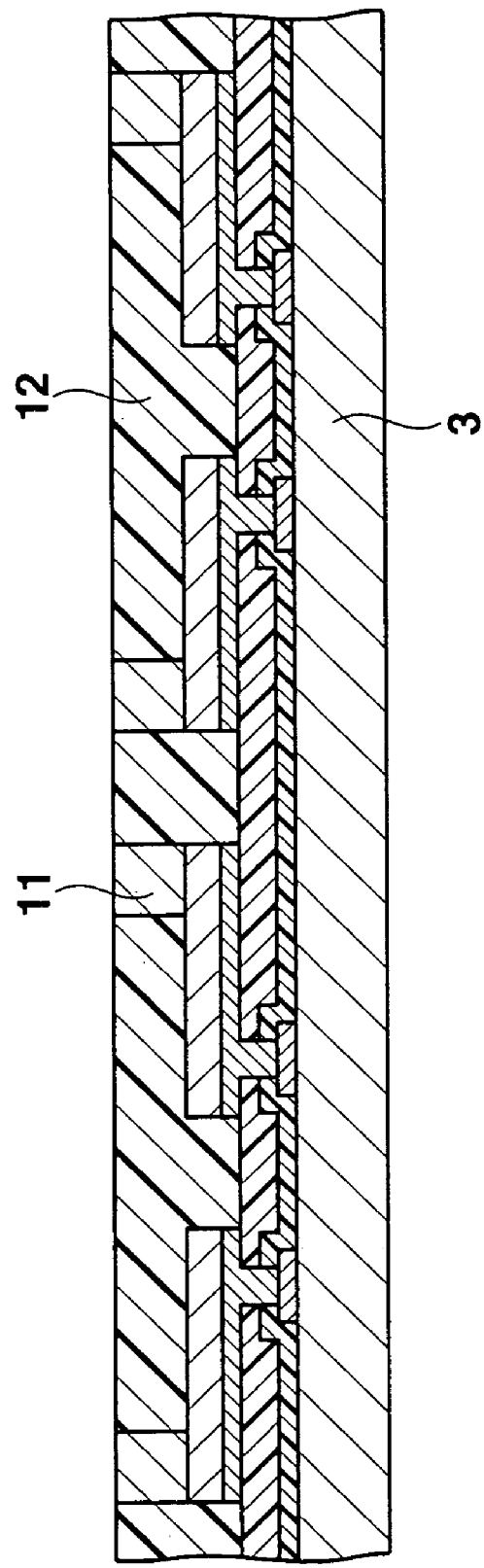
FIG. 7 is a sectional view of a fabrication step following FIG. 6.
Figure 8:
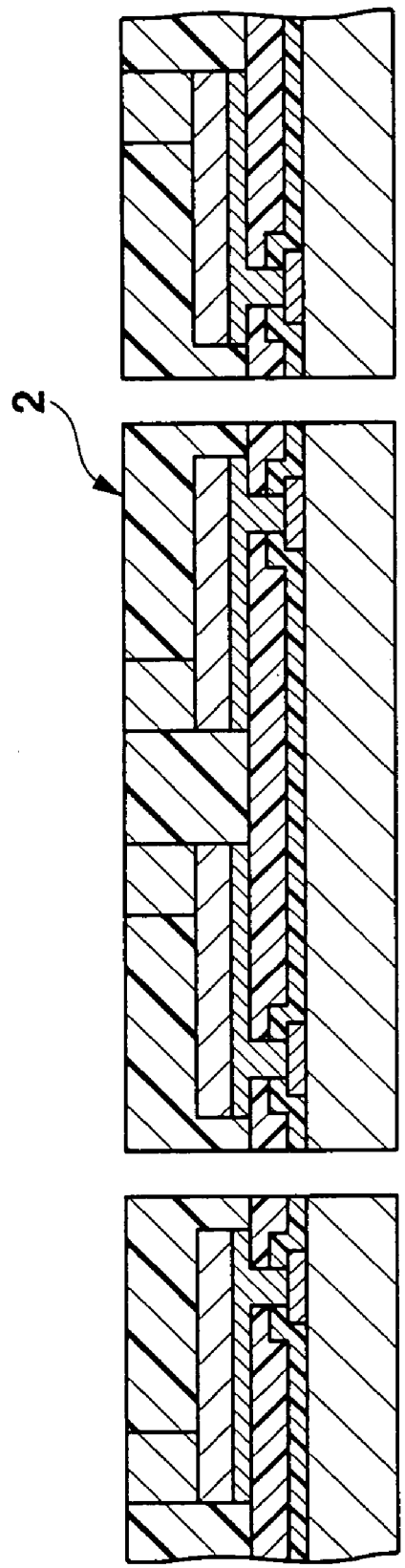
FIG. 8 is a sectional view of a fabrication step following FIG. 7.

As shown in FIG. 7, the sealing film 12 and the upper surfaces of the columnar electrodes 11 are properly polished to expose the upper surfaces of the columnar electrodes 11, and planarize the upper surface of the sealing film 12 including those exposed upper surfaces of the columnar electrodes 11. The upper surfaces of the columnar electrodes 11 are thus properly polished in order to make the heights of the columnar electrodes 11 uniform by eliminating variations in height of the columnar electrodes 11 formed by electroless plating. Then, the silicon substrate 3 is adhered to a dicing tape (not shown), and a dicing step shown in FIG.

8 is performed. After that, the silicon substrate 3 is removed from the dicing tape to obtain a plurality of semiconductor constructing bodies 2 shown in FIG. 1.

Figure 9:
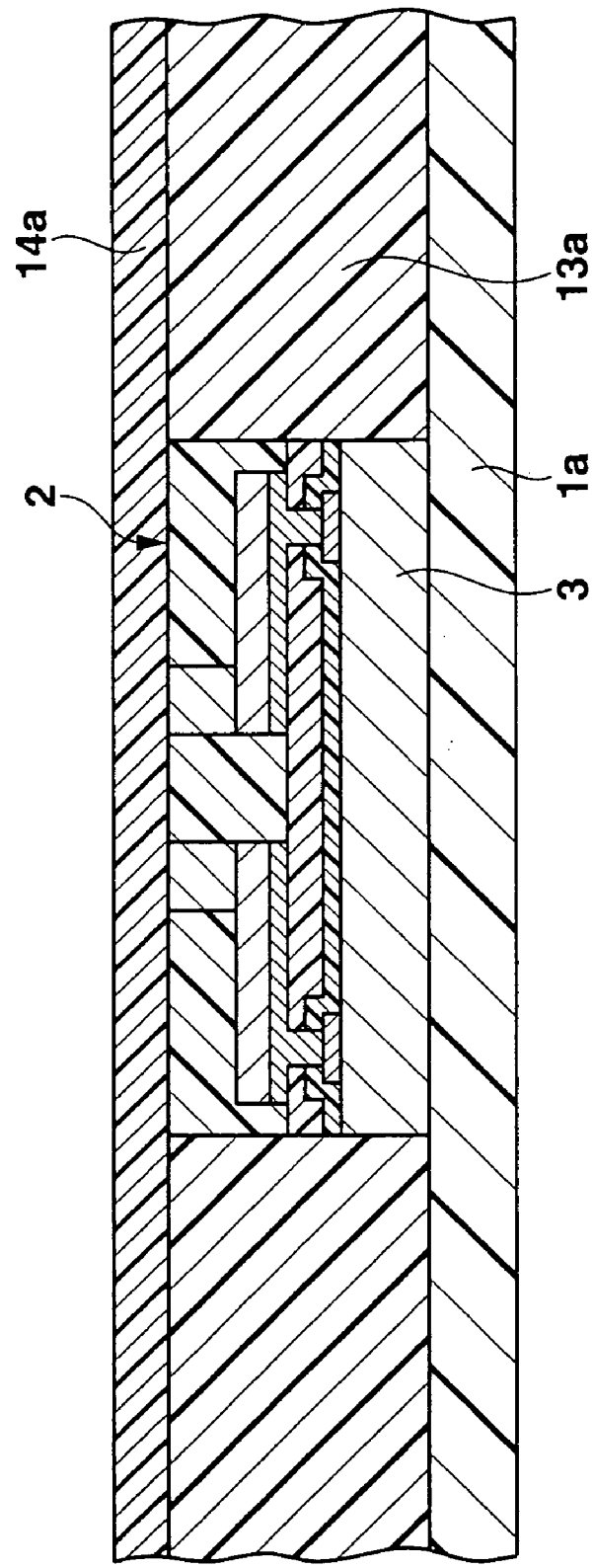
FIG. 9 is a sectional view of a fabrication step following FIG. 8.

An example of a method of fabricating the semiconductor device shown in FIG. 1 by using the semiconductor constructing body 2 thus obtained will be described below. First, as shown in FIG. 9, a base plate formation sheet (base member formation member) 1a is prepared. The base plate formation sheet 1a has a size capable of forming a plurality of base plates 1 shown in FIG. 1, and is made of a prepreg material having a square planar shape, although the material is not particularly limited. In this state, a thermo-setting resin such as an epoxy-based resin contained in the prepreg material forming the base plate formation sheet 1a is semi-hardened.

Then, the lower surfaces of the silicon substrates 3 of the semiconductor constructing bodies 2 are temporarily bonded by heat and pressure (temporarily fixed) to a plurality of predetermined portions on the upper surface of the base plate formation sheet 1a. That is, a bonding tool (not shown) having a heating mechanism is used to temporarily fix the semiconductor constructing body 2 to each predetermined portion on the upper surface of the base plate formation sheet 1a while a predetermined pressure is applied in a preheated state. For example, the temporary fixing conditions are a temperature of 90° C. to 130° C. and a pressure of 0.1 to 1 Mpa.

An insulating layer formation layer 13a is formed on the upper surface of the base plate formation sheet 1a around the semiconductor constructing body 2 by, e.g., screen printing or spin coating. The insulating layer formation layer 13a is made of, e.g., a thermosetting resin such as an epoxy-based resin or polyimide-based resin, or a material obtained by mixing, in a thermosetting resin like this, a reinforcing material, e.g., fibers made of an inorganic material such as silica or glass.

Subsequently, a first upper insulating film formation sheet 14a is placed on the upper surfaces of the semiconductor constructing body 2 and insulating layer formation layer 13a. The first upper insulating film formation sheet 14a is preferably made of a sheet-like buildup material, although the material is not particularly limited. For example, this buildup material is obtained by mixing a reinforcing material such as a silica filler in a thermosetting resin such as an epoxy-based resin, and semi-hardening the thermosetting resin. Note that it is also possible to use, as the first upper insulating film formation sheet 14a, a prepreg material obtained by impregnating fibers made of an inorganic material such as glass with a thermosetting resin such as an epoxy-based resin, and semi-hardening the thermosetting resin into the form of a sheet, or a sheet made only of a semi-hardened thermosetting resin in which no reinforcing material is mixed.

Figure 10:
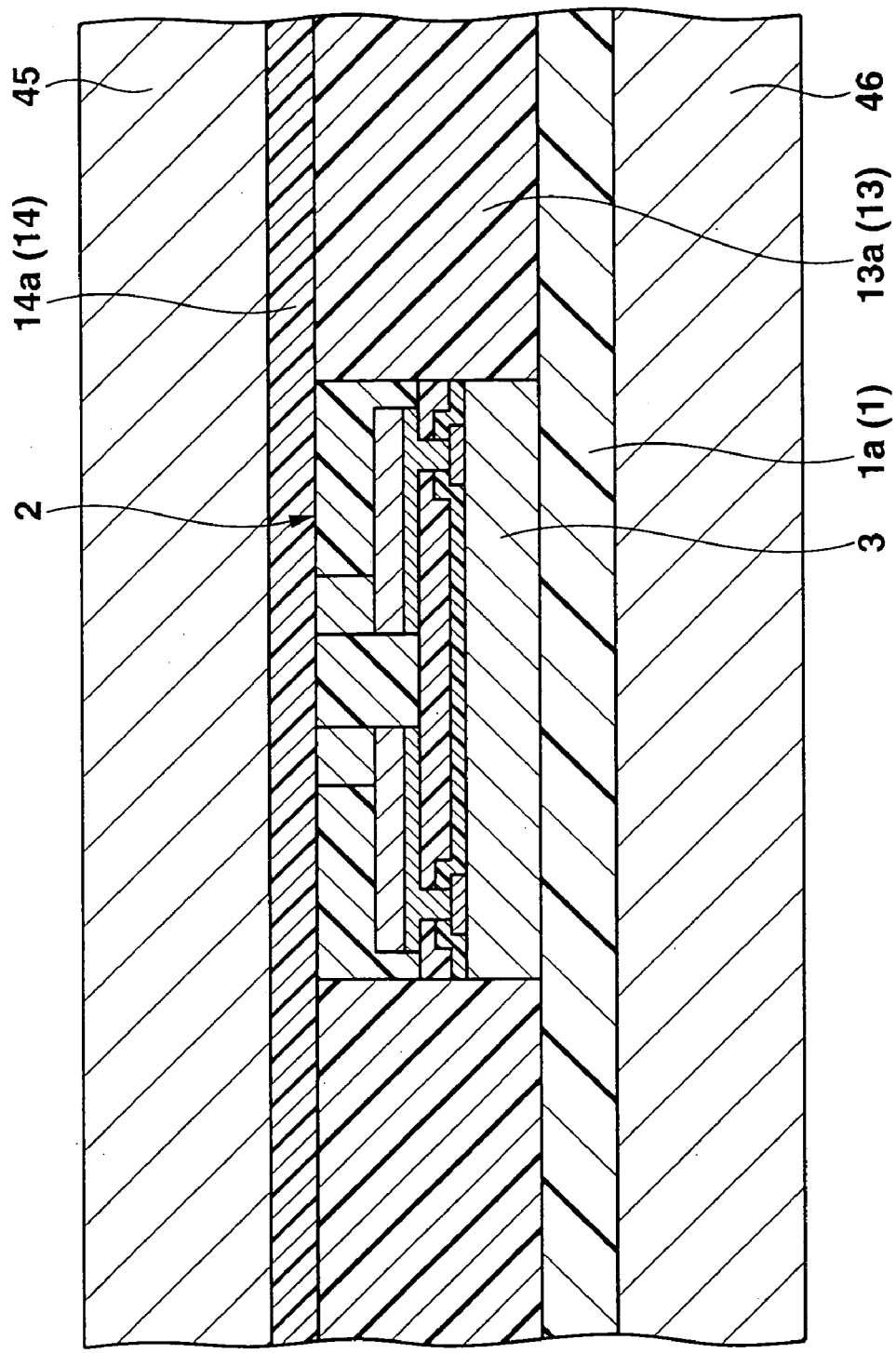
FIG. 10 is a sectional view of a fabrication step following FIG. 9.

As shown in FIG. 10, a pair of heating/pressing plates 45 and 46 are used to heat and press, from above and below, the base plate formation sheet 1a, insulating layer formation sheet 13a, and first upper insulating film formation sheet 14a. The heating/pressing conditions depend on the material and the like. For example, the temperature is 185° C. to 200° C. (the heating rate is 2.5° C./min to 3° C./min), the pressure is about 30 kg/cm² (the heating timing is when the temperature is 90° C. to 100° C.), and the time is 60 min or more.

By this heating and pressing, the thermosetting resin in the base plate formation sheet 1a hardens to form a base plate 1, and the lower surface of the silicon substrate 3 of the semiconductor constructing body 2 is directly fixed to the upper surface of the base plate 1 by fixing force of the base plate 1. Also, the insulating layer formation layer 13a and first upper insulating film formation sheet 14a harden by this heating and pressing, thereby forming an insulating layer 13 on the upper surface of the base plate 1 around the semiconductor constructing body 2, and a first upper insulating film 14 on the upper surfaces of the semiconductor constructing body 2 and insulating layer 13. In this state, the upper surface of the first upper insulating film 14 is a flat surface because it is pressed by the lower surface of the upper heating/pressing plate 45. Accordingly, no polishing step of planarizing the upper surface of the first upper insulting film 14 is necessary.

Figure 11:
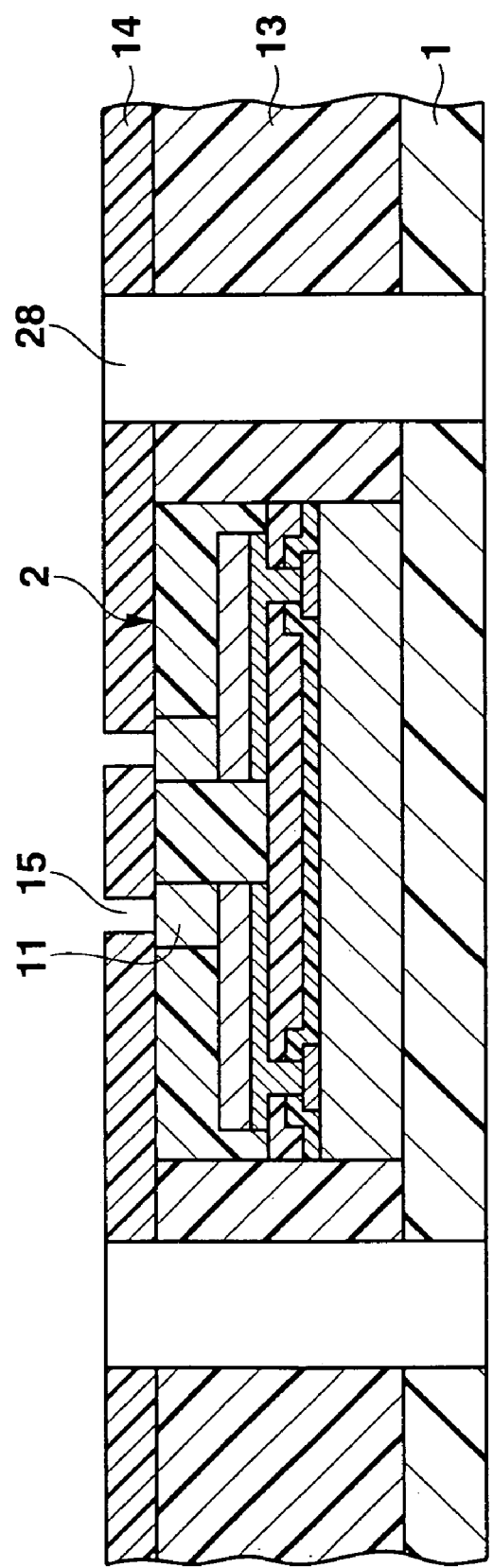
FIG. 11 is a sectional view of a fabrication step following FIG. 10.

As shown in FIG. 11, laser processing which radiates a laser beam is used to form holes 15 in those portions of the first upper insulating film 14, which correspond to the central portions of the upper surfaces of the columnar electrodes 11. Also, a mechanical drill is used to form through holes 28 in predetermined portions of the first upper insulating film 14, insulating layer 13 and base plate 1. Then, if necessary, epoxy smear and the like occurred in the holes 15 and through holes 28 are removed by a desmear process.

Figure 12:
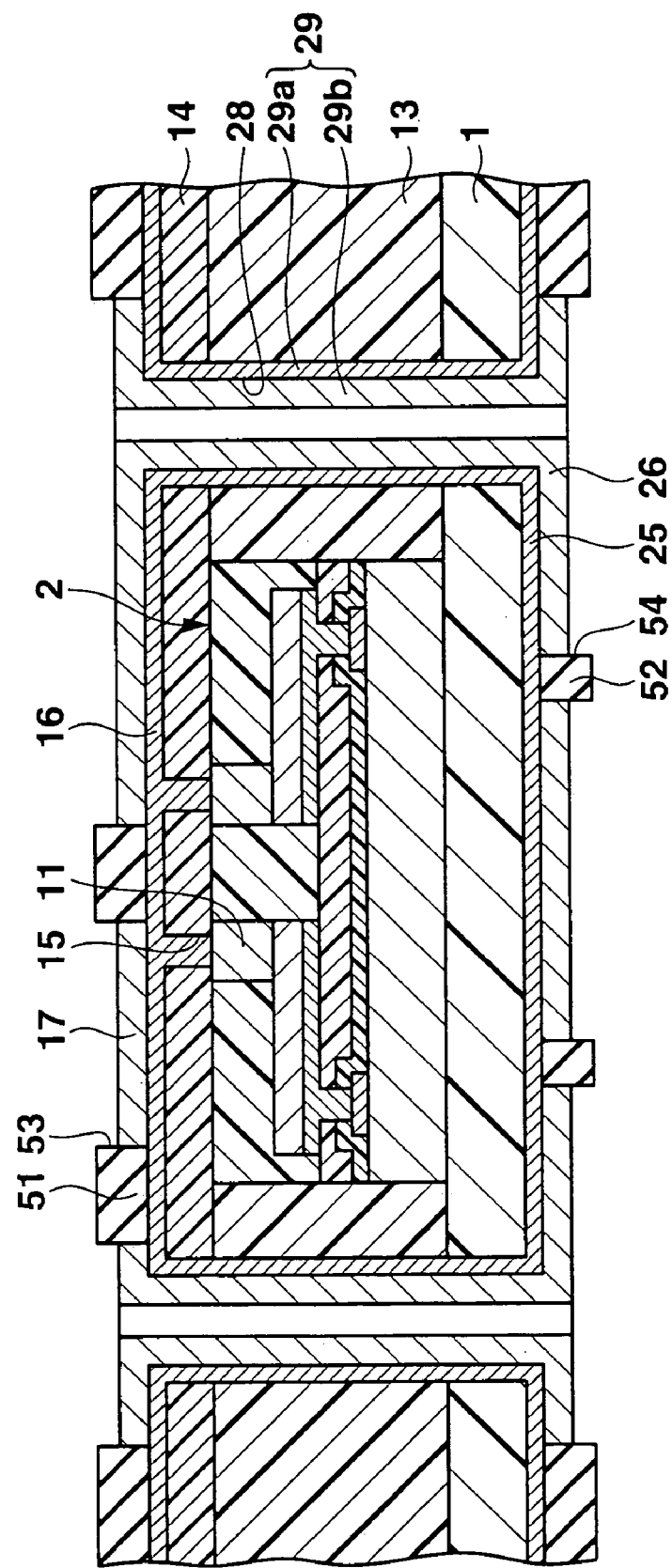
FIG. 12 is a sectional view of a fabrication step following FIG. 11.

As shown in FIG. 12, a first upper metal undercoating 16, lower metal undercoating 25, and metal undercoating 29a are formed by electroless plating of copper on the entire upper surface of the first upper insulating film 14 including the upper surfaces of the columnar electrodes 11 exposed through the holes 15, on the entire lower surface of the base plate 1, and on the inner wall surfaces of the through holes 28. An upper plating resist film 51 is then formed by patterning on the upper surface of the first upper metal undercoating 16, and a lower plating resist film 52 is formed by patterning on the lower surface of the lower metal undercoating 25. In this state, holes 53 are formed in those portions of the upper plating resist film 51, which correspond to formation regions of first upper interconnections 17. In addition, holes 54 are formed in those portion of the lower plating resist film 52, which correspond to formation regions of lower interconnections 26.

Electroless plating of copper is then performed by using the metal undercoatings 16, 25, and 29a as plating current paths, thereby forming first upper interconnections 17 on the upper surface of the first upper metal undercoating 16 in the holes 53 of the upper plating resist film 51. Simultaneously, lower interconnections 26 are formed on the lower surface of the lower metal undercoating 25 in the holes 54 of the lower plating resist film 52. In addition, a copper layer 29b is simultaneously formed on the surface of the metal undercoating 29a in the through holes 28.

Figure 13:
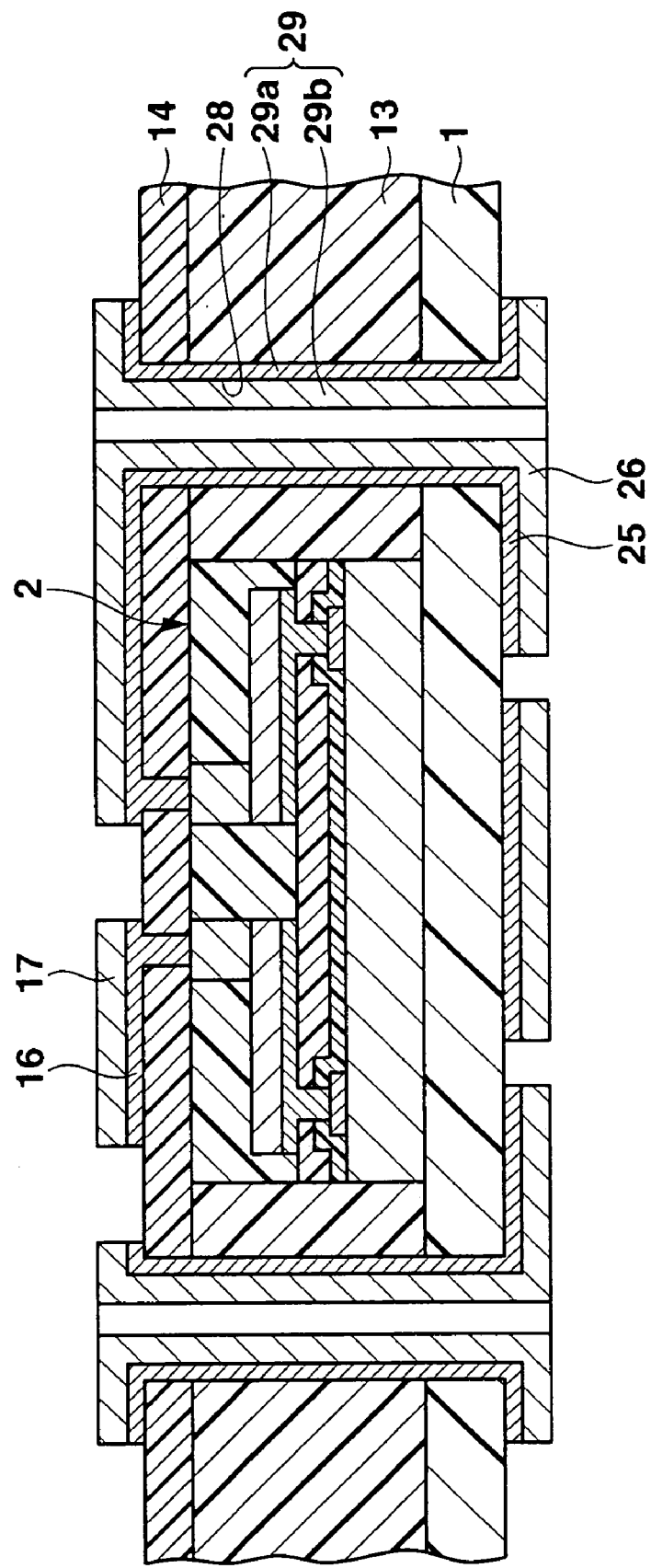
FIG. 13 is a sectional view of a fabrication step following FIG. 12.

After that, the plating resist films 51 and 52 are removed, and unnecessary portions of the first upper metal undercoating 16 and lower metal undercoating 25 are etched away by using the first upper interconnections 17 and lower interconnections 26 as masks. Consequently, as shown in FIG. 13, the first upper metal undercoating 16 remains only below the first upper interconnections 17, and the lower metal undercoating layer 25 remains only on the lower interconnections 26. In this state, vertical conducting portions 29 made up of the metal undercoating 29a and copper layer 29b are formed in the through holes 28.

Figure 14:
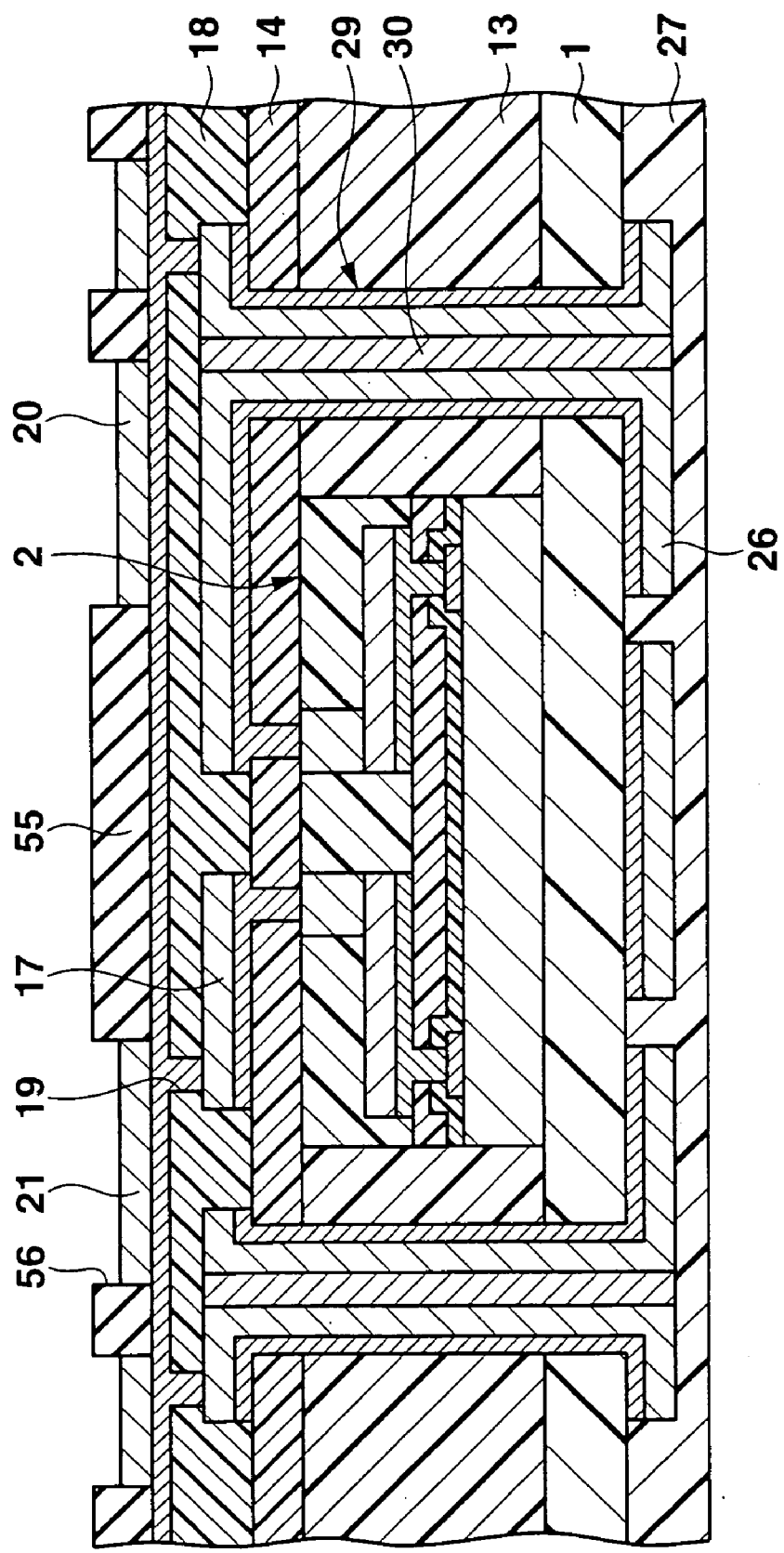
FIG. 14 is a sectional view of a fabrication step following FIG. 13.

As shown in FIG. 14, screen printing or the like is used to fill the vertical conducting portions 29 with a conductive material 30 such as copper paste, silver paste, or conductive resin. If necessary, an extra conductive material 30 over-flowing from the vertical conducting portions 29 is removed by buffing or the like. Then, screen printing or spin coating, for example, is used to form a lower insulating film 27 made of a solder resist or the like on the entire lower surface of the base plate 1 including the lower interconnections 26.

A second upper insulating film 18 made of the same material as the first upper insulating film 14 is formed on the upper surface of the first upper insulating film 14 including the first upper interconnections 17. Then, laser processing which radiates a laser beam is used to form holes 19 in those portions of the second upper insulating film 18, which correspond to connecting pad portions of the first upper interconnections 17. If necessary, epoxy smear or the like occurred in the holes 19 is removed by a desmear process.

A second upper metal undercoating 20 is formed by, e.g., electroless plating of copper on the entire upper surface of the second upper insulating film 18 including those connecting pad portions of the first upper interconnections 17, which are exposed through the holes 19. A plating resist film 55 is then formed by patterning on the upper surface of the second upper metal undercoating 20. In this state, holes 56 are formed in those portions of the plating resist film 55, which correspond to formation regions of second upper interconnections 21.

Figure 15:
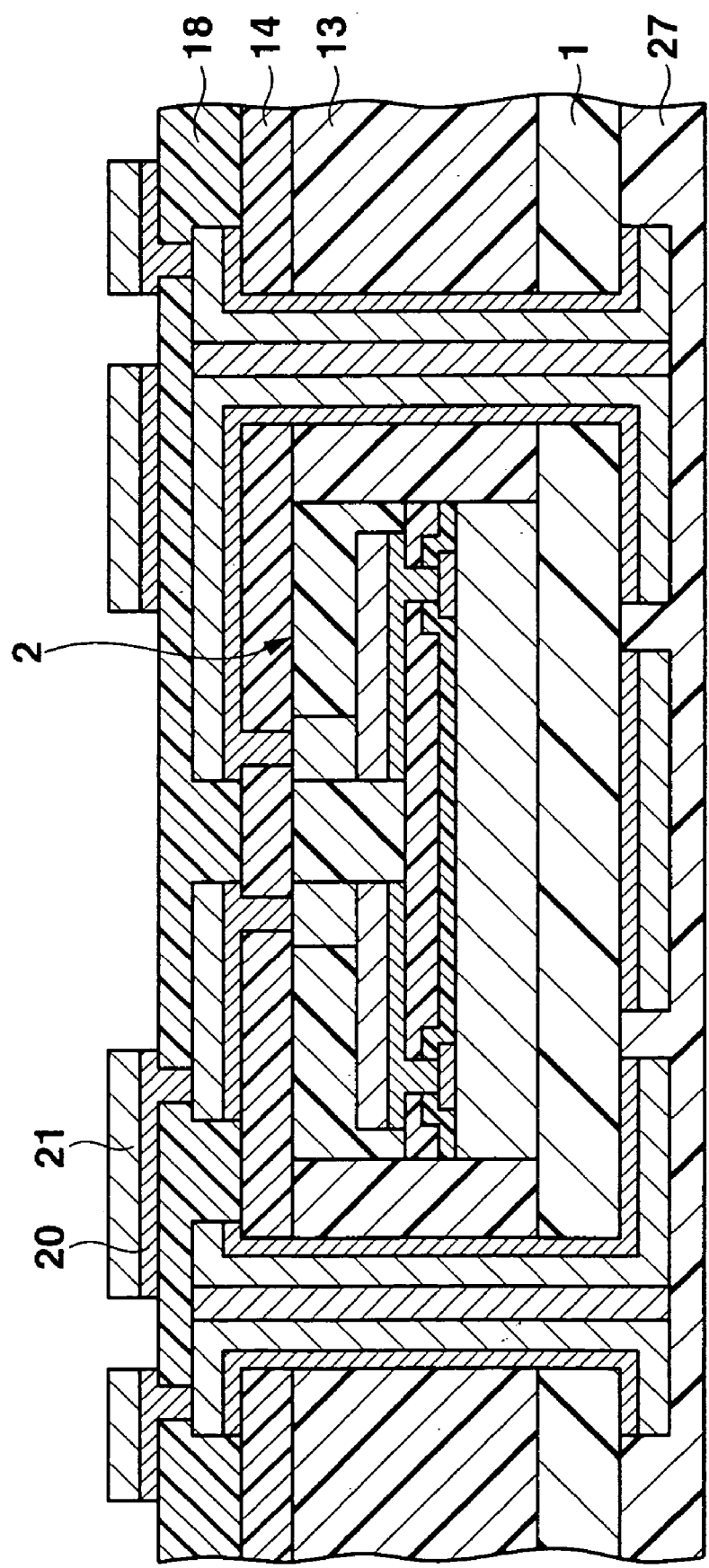
FIG. 15 is a sectional view of a fabrication step following FIG. 14.

Subsequently, electroplating of copper is performed using the second upper metal undercoating 20 as a plating current path, thereby forming second upper interconnections 21 on the upper surface of the second upper metal undercoating 20 in the holes 56 of the plating resist film 55. After that, the plating resist film 55 is removed, and the second upper interconnections 21 are used as masks to remove unnecessary portions of the second upper metal undercoating 20. Consequently, as shown in FIG. 15, the second upper metal undercoating 20 remains only below the second upper interconnections 21.

Figure 16:
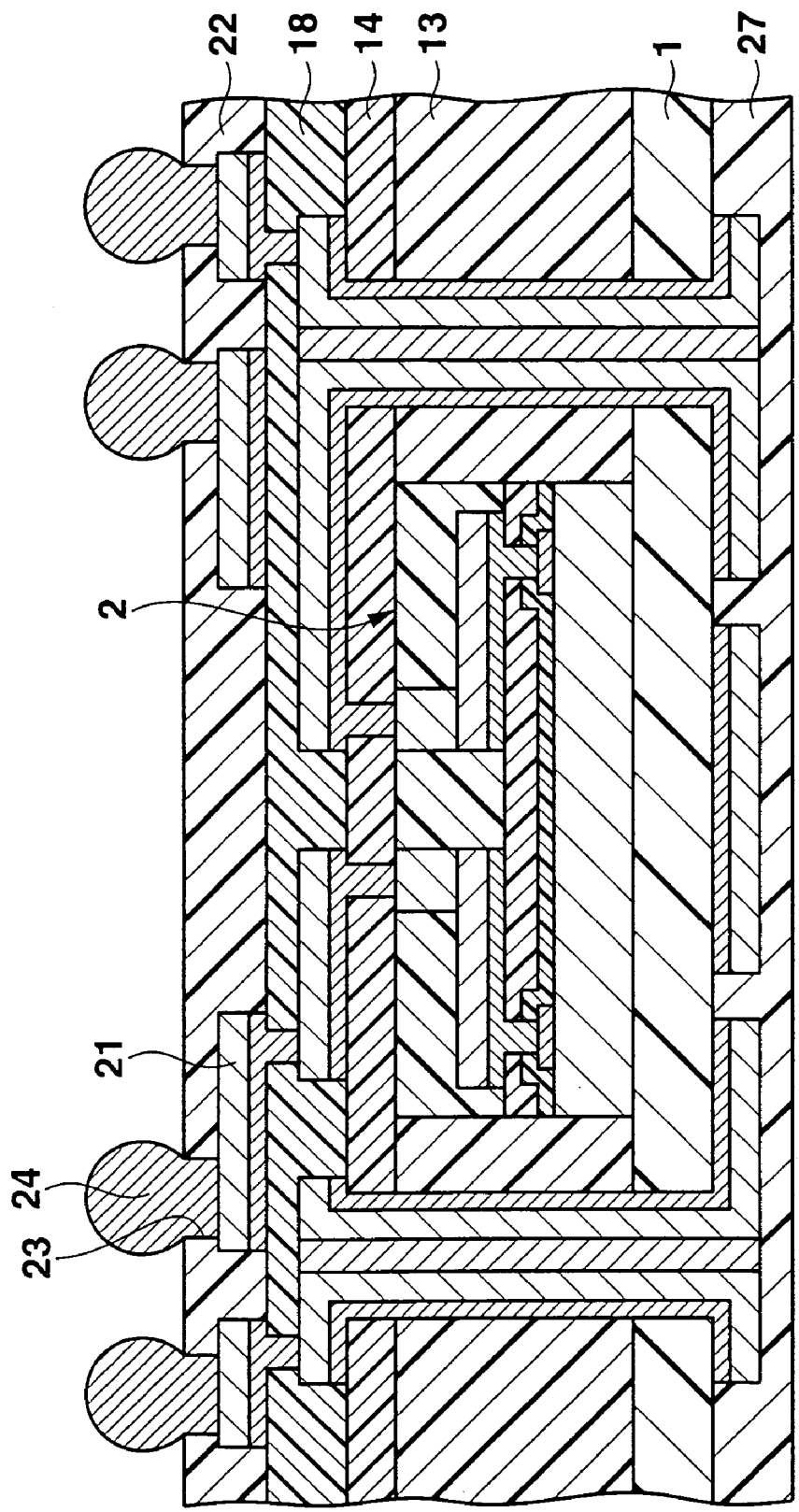
FIG. 16 is a sectional view of a fabrication step following FIG. 15.

As shown in FIG. 16, an uppermost insulating film 22 made of a solder resist or the like is formed by, e.g., screen printing or spin coating on the upper surface of the second upper insulating film 18 and the second upper interconnections 21. In this state, holes 23 are formed in those portions of the uppermost insulating film 22, which correspond to connecting pad portions of the second upper interconnections 21. Solder balls 24 are formed in and above the holes 23 so as to be connected to the connecting pad portions of the second upper interconnections 21. Finally, the uppermost insulating film 22, second upper insulating film 18, first upper insulating film 14, insulating layer 13, base plate 1, and lower insulating film 27 are cut between the semiconductor constructing bodies 2 adjacent to each other, thereby obtaining a plurality of semiconductor devices shown in FIG. 1.

In the semiconductor device thus obtained, the lower surface of the silicon substrate 3 of the semiconductor constructing body 2 is directly fixed to the upper surface of the base plate 1 made of a prepreg material, i.e., a material containing a thermosetting resin such as an epoxy-based resin. Since, therefore, no such adhesive layer as used in the conventional devices is used, the semiconductor device can be made thin accordingly. Also, the amounts of voids and water in the base plate 1 made of the prepreg material are extremely small, and these voids and water in the base plate 1 below the semiconductor constructing body 2 can move to the periphery. Accordingly, during reflow (the temperature is 240° C. to 260° C.) when this semiconductor device is mounted on a circuit board (not shown) via the solder balls 24, the voids and water in the base plate 1 below the semiconductor constructing body 2 hardly expand. This makes it possible to improve the reliability of adhesion of the silicon substrate 3 of the semiconductor constructing body 2 to the base plate 1.

In the above fabrication method, a plurality of semiconductor constructing bodies 2 are temporarily fixed on the base plate formation sheet 1a, and the first and second upper interconnections 17 and 21, lower interconnections 26, vertical conducting portions 29, and solder balls 24 are collectively formed on the semiconductor constructing bodies 2. Since the resultant structure is cut into a plurality of semiconductor devices after that, the fabrication steps can be simplified. Also, a plurality of semiconductor constructing bodies 2 can be transferred together with the base plate 1 from the fabrication step shown in FIG. 10. This also simplifies the fabrication steps.

Second Embodiment

Figure 17:
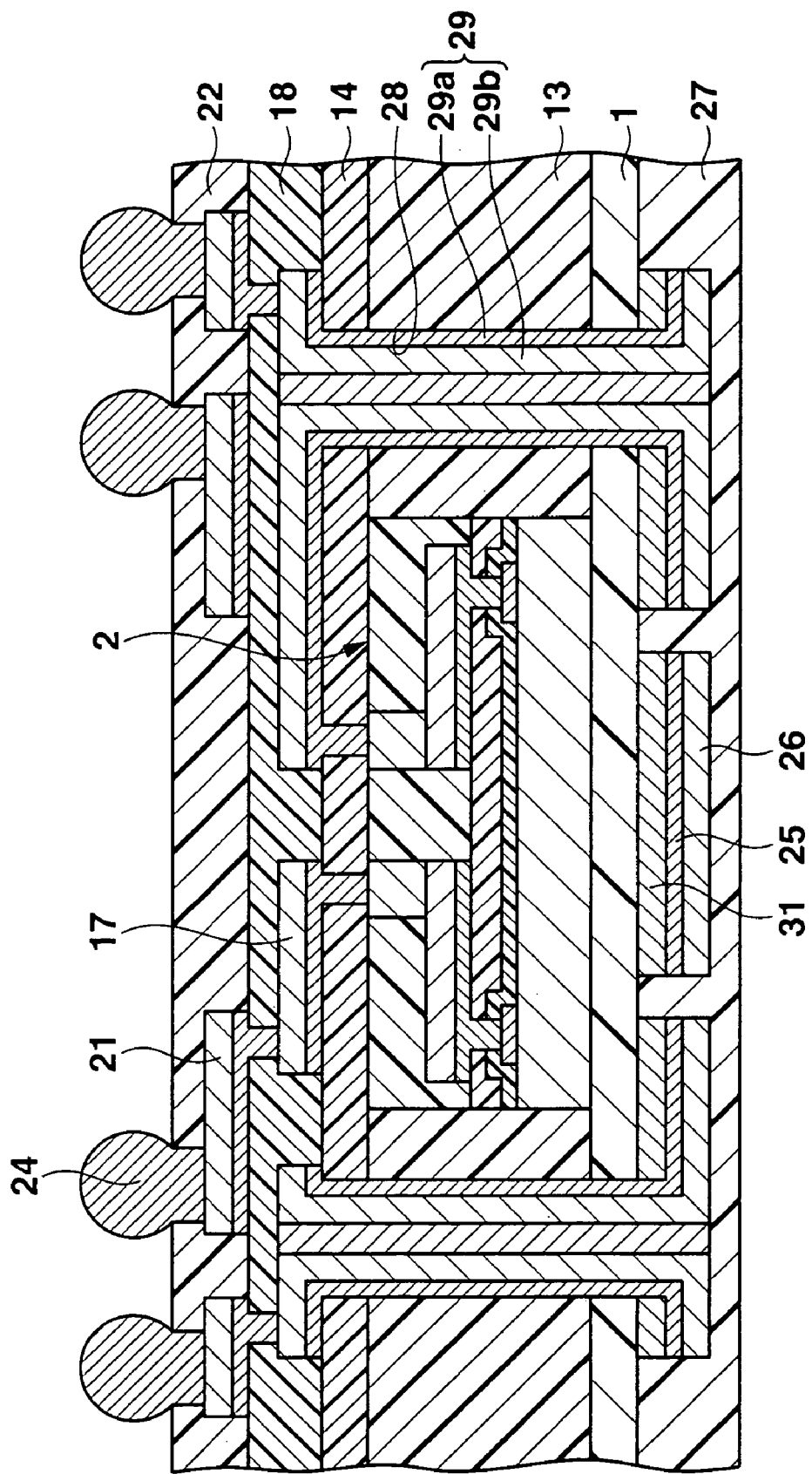
FIG. 17 is a sectional view of a semiconductor device according to the second embodiment of the present invention.

FIG. 17 is a sectional view of a semiconductor device according to the second embodiment of the present invention. This semiconductor device differs from that of the first embodiment in that lower interconnections 26 including a lower metal undercoating 25 are formed on the entire lower surface of a metal layer 31 formed by copper or the like on the lower surface of a base plate 1, and the thickness of the base plate 1 made of a prepreg material is made smaller to some extent than that in the first embodiment.

Figure 18:
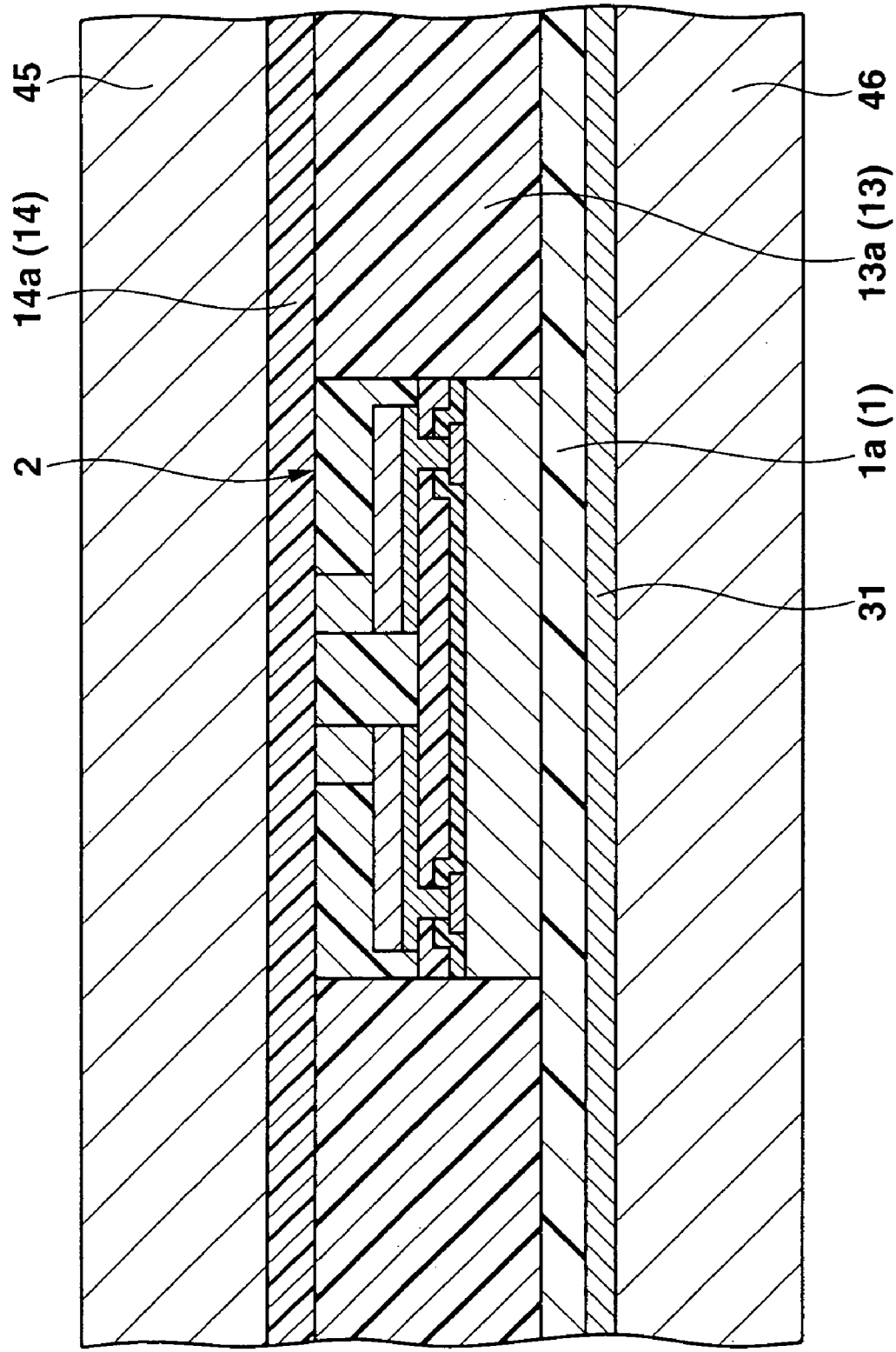
FIG. 18 is a sectional view of a predetermined fabrication step of an example of a method of fabricating the semiconductor device shown in FIG. 17.
Figure 19:
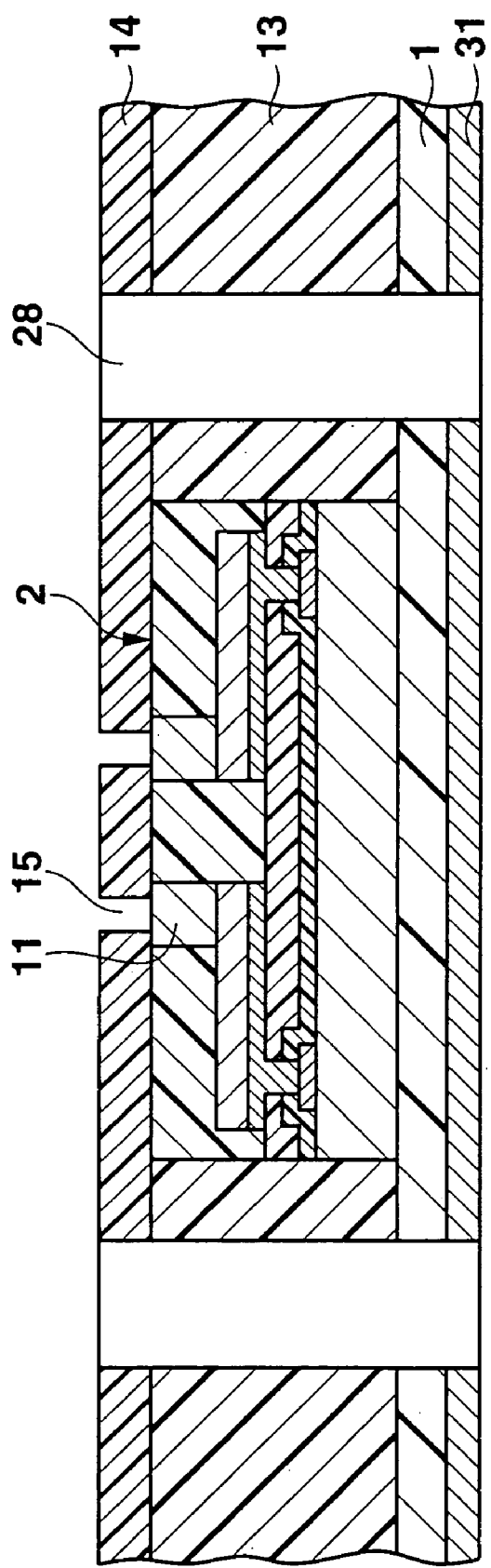
FIG. 19 is a sectional view of a fabrication step following FIG. 18.

When the semiconductor device of the second embodiment is to be fabricated, in the step shown in FIG. 10, as shown in FIG. 18, a metal layer 31 made of a copper foil or copper plate is placed on the lower surface of a base plate formation sheet 1a, and fixed to the lower surface of a base plate 1 by heating and pressing from above and below by a pair of heating/pressing plates 45 and 46. In this case, the metal layer 31 also has the function of a support plate which supports the relatively thin base plate 1. Then, as shown in FIG. 19, a mechanical drill is used to form through holes 28 in predetermined portions of a first upper insulating film 14, an insulating layer 13, the base plate 1, and the metal layer 31.

Figure 20:
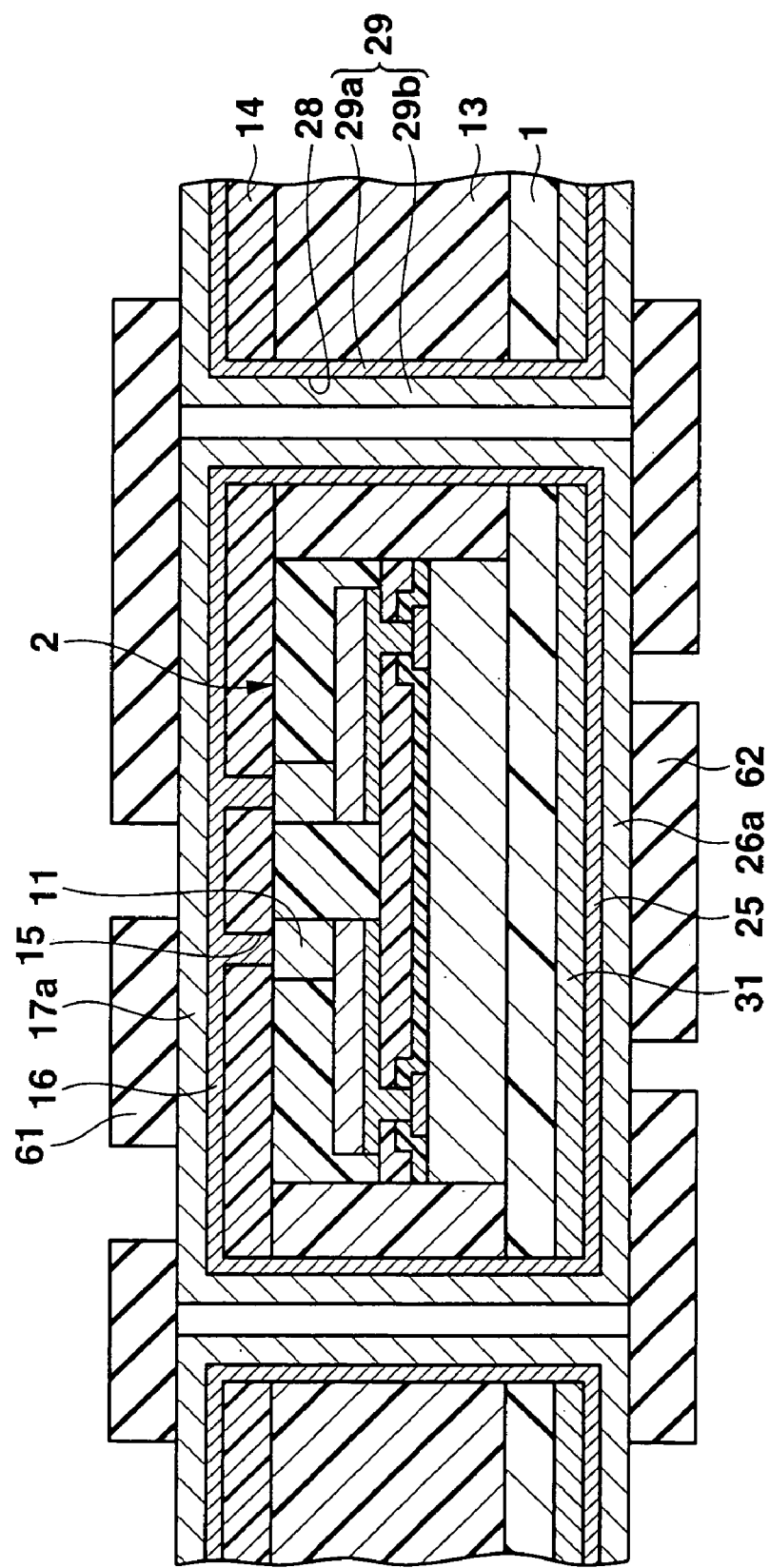
FIG. 20 is a sectional view of a fabrication step following FIG. 19.

As shown in FIG. 20, a first upper metal undercoating 16, lower metal undercoating 25, and metal undercoating 29a are formed by electroless plating of copper on the entire upper surface of the first upper insulating film 14 including the upper surfaces of columnar electrodes 11 exposed through holes 15, on the entire lower surface of the base plate 1, and on the inner wall surfaces of the through holes 28. Electroplating of copper is then performed by using the metal undercoatings 16, 25, and 29a as plating current paths, thereby forming an upper metal 17a, lower metal 26a, and metal 29b on the entire surfaces of the metal undercoatings 16, 25, and 29a.

Figure 21:
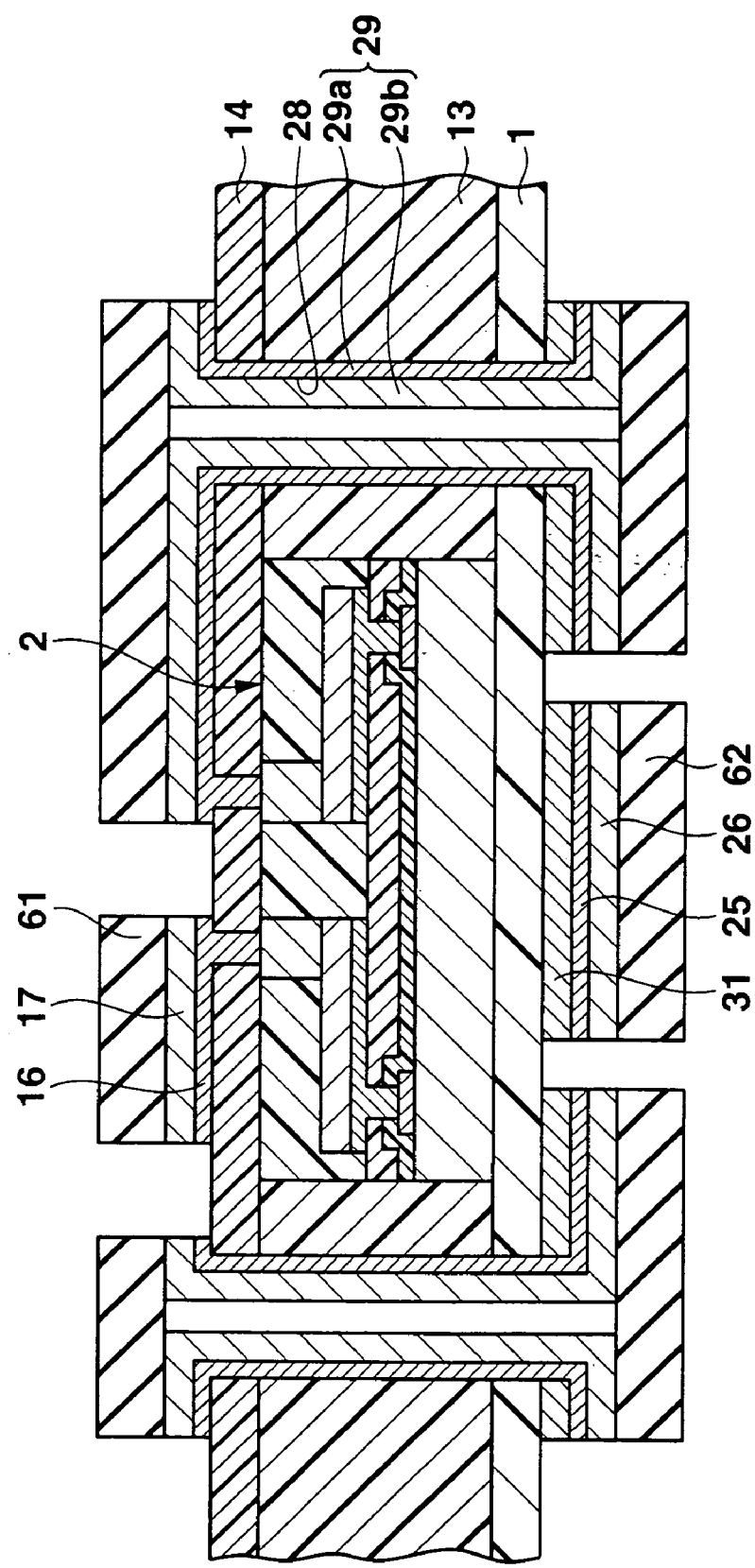
FIG. 21 is a sectional view of a fabrication step following FIG. 20.

Subsequently, an upper resist film 61 is formed in formation regions of first upper interconnections 17 on the upper surface of the upper metal 17a, and a lower resist film 62 is formed in formation regions of lower interconnections 26 on the lower surface of the lower metal 26a. When etching is performed using the two resist films 61 and 62 as masks, as shown in FIG. 21, first upper interconnections 17 including the first upper metal undercoating 16 are formed below the upper resist film 61, and lower interconnections 26 including the metal layer 31 and lower metal undercoating 25 are formed on the lower resist film 62. In addition, vertical conducting portions 29 made up of the metal undercoating 29a and metal 29b are formed in the through holes 28. After that, the two resist films 61 and 62 are peeled. The subsequent steps are the same as in the first embodiment described above, so an explanation thereof will be omitted.

Other Embodiments

In the first embodiment, the base plate 1 is a single member made of, e.g., a prepreg material. However, the base plate may also have a stacked structure in which a prepreg material is fixed on the upper surface of a hard sheet obtained by completely hardening a thermosetting resin such as an epoxy resin containing glass fibers, an aramid material, or a polyimide material. When the base plate having this stacked structure is used, the hard sheet and prepreg material are temporarily adhered beforehand, and semiconductor constructing bodies are fixed on the surface of the prepreg material by heat and pressure. The hard sheet can be peeled off before dicing, or left behind as a finished product.

In FIG. 1, the upper interconnections formed on the first upper insulating film 14 are made up of two layers, and the lower interconnections formed below the base plate 1 are made up of a single layer. However, the number of layers of the upper interconnections formed on the first upper insulating film 14 may also be one or three or more, and the number of layers of the lower interconnections formed below the base plate 1 may also be two or more. Also, electronic parts such as chip parts may also be mounted below the lowermost insulating film which covers the lowermost interconnections, so as to be connected to the connecting pad portions of the lowermost interconnections.

In the above embodiments, the semiconductor wafer is cut between the semiconductor constructing bodies 2 adjacent to each other. However, two or more semiconductor constructing bodies 2 may also be separated together as one set to obtain a multi-chip-module semiconductor device. In this semiconductor device, the types of a plurality of semiconductor constructing bodies 2 forming one set can be either the same or different.

Furthermore, in the above embodiments, the semiconductor constructing body 2 has the columnar electrodes 11 as external connecting electrodes. However, it is also possible to form interconnections 10 having connecting pad portions as external connecting electrodes, without forming any columnar electrodes, and form an overcoat film which covers portions except for the connecting pad portions of the interconnections. Alternatively, it is possible to form an overcoat film which covers portions except for connecting pad portions of interconnections 10, without forming any columnar electrodes 11, and form connecting pads as external connecting electrodes on the connecting pad portions of the interconnections 10 and on the upper surface of the overcoat film near these connecting pad portions.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor device fabrication method comprising:
   temporarily fixing, on a base member formation member made of a material containing at least a semi-hardened thermosetting resin, a plurality of semiconductor constructing bodies each having a semiconductor substrate and a plurality of external connecting electrodes formed on the semiconductor substrate, such that the plurality of semiconductor constructing bodies are separated from each other;
   providing an insulating layer formation sheet, which contains at least a semi-hardened thermosetting resin, on the base member formation member around the semiconductor constructing bodies;
   heating and pressing to: (i) form a base member by hardening the thermosetting resin contained in the base member formation member, fixing the semiconductor constructing bodies to the base member by (ii) fix force of the thermosetting resin in the base member that is present on a surface of the base member contacting the semiconductor constructing bodies, and (iii) form an insulating layer on the base member around the semiconductor constructing bodies by hardening the insulating lever formation sheet;
   forming at least one layer of an interconnection on the semiconductor constructing bodies and insulating layer, such that the layer of the interconnection includes at least one interconnection connected to the external connecting electrodes; and
   cutting the insulating layer and base member between the semiconductor constructing bodies to obtain a plurality of semiconductor devices each including at least one of the semiconductor constructing bodies.

2. A method according to claim 1, wherein the temporarily fixing the semiconductor constructing bodies comprises:
   preheating the semiconductor constructing bodies; and
   temporarily fixing the semiconductor constructing bodies with heat and pressure.

3. A method according to claim 1, wherein the base member formation member comprises a prepreg material.

4. A method according to claim 1, wherein the external connecting electrodes of the semiconductor constructing bodies comprise columnar electrodes.

5. A semiconductor device fabrication method comprising:
   temporarily fixing, on a base member formation member made of a material containing at least a semi-hardened thermosetting resin, a plurality of semiconductor constructing bodies each having a semiconductor substrate and a plurality of external connecting electrodes formed on the semiconductor substrate, such that the plurality of semiconductor constructing bodies are separated from each other;
   forming a base member by hardening the thermosetting resin contained in the base member formation member, fixing the semiconductor constructing bodies to the base member by fixing force of the base member, and forming an insulating layer on the base member around the semiconductor constructing bodies;
   forming at least one layer of an interconnection on the semiconductor constructing bodies and insulating layer, such that the layer of the interconnection includes at least one interconnection connected to the external connecting electrodes; and
   cutting the insulating layer and base member between the semiconductor constructing bodies to obtain a plurality of semiconductor devices each including at least one of the semiconductor constructing bodies;
   wherein the fixing of the semiconductor constructing bodies to the base member by the fixing force of the base member comprises hardening the thermosetting resin contained in the base member formation member by heating and pressing the semiconductor constructing bodies by using a heating/pressing plate.

6. A device according to claim 5, wherein the forming of the insulating layer comprises:

forming an insulating layer formation layer made of a material containing at least a thermosetting resin on the base member around the semiconductor constructing bodies;

heating and pressing the semiconductor constructing bodies and the insulating layer formation layer by using the heating/pressing plate, thereby hardening the thermosetting resin contained in the base member formation member and fixing the semiconductor constructing bodies to the base member by the fixing force of the base member, and at the same time forming the insulating layer on the base member around the semiconductor constructing bodies by hardening the thermosetting resin contained in the insulating layer formation layer.

7. A method according to claim 1, wherein the forming of the base member comprises preparing a hard sheet, and fixing the base member formation member on the hard sheet.

8. A method according to claim 7, wherein the hard sheet is made of a metal material.

* * * * *